(12) United States Patent
Ro et al.

(10) Patent No.: US 11,609,786 B2
(45) Date of Patent: Mar. 21, 2023

(54) HIERARCHICAL REGISTER FILE DEVICE BASED ON SPIN TRANSFER TORQUE-RANDOM ACCESS MEMORY

(71) Applicant: INDUSTRY-ACADEMIC COOPERATION FOUNDATION, YONSEI UNIVERSITY, Seoul (KR)

(72) Inventors: Won Woo Ro, Seoul (KR); Jun Hyun Park, Seoul (KR)

(73) Assignee: INDUSTRY-ACADEMIC COOPERATION FOUNDATION, YONSEI UNIVERSITY, Seoul (KR)

(*) Notice: Subject to any disclaimer, the term of this patent is extended or adjusted under 35 U.S.C. 154(b) by 549 days.

(21) Appl. No.: 16/782,983

(22) Filed: Feb. 5, 2020

(65) Prior Publication Data

US 2020/0319923 A1 Oct. 8, 2020

(30) Foreign Application Priority Data

Apr. 3, 2019 (KR) .................. 10-2019-0039236

(51) Int. Cl.
*G06F 9/30* (2018.01)
*G06F 9/48* (2006.01)
*G06F 9/38* (2018.01)
*G11C 11/16* (2006.01)
(Continued)

(52) U.S. Cl.
CPC .......... *G06F 9/4881* (2013.01); *G06F 3/0608* (2013.01); *G06F 3/0659* (2013.01); *G06F 3/0683* (2013.01); *G06F 9/30007* (2013.01); *G06F 9/3012* (2013.01); *G06F 9/30047* (2013.01); *G06F 9/30101* (2013.01); *G06F 9/30138* (2013.01); *G06F 9/30141* (2013.01); *G06F 9/3824* (2013.01); *G09G 5/363* (2013.01);
(Continued)

(58) Field of Classification Search
CPC . G06F 9/30007; G06F 9/30141; G06F 9/3012
See application file for complete search history.

(56) References Cited

U.S. PATENT DOCUMENTS 7,834,881 B2 * 11/2010 Liu .................... G06F 9/30123
345/557
2011/0131379 A1 * 6/2011 Jain .................... G06F 12/0804
711/143
(Continued)

FOREIGN PATENT DOCUMENTS

KR 20160138878 A 12/2016

OTHER PUBLICATIONS

Sangpil Lee, et al., "Warped-Compression: Enabling Power Efficient GPUs through Register Compression," Jun. 2015, Association for Computing Machinery (ACM), pp. 502-514 (Year: 2015).*
(Continued)

*Primary Examiner* — Michael J Metzger

(57) ABSTRACT

The embodiments provide a register file device which increases energy efficiency using a spin transfer torque-random access memory for a register file used to compute a general purpose graphic processing device, and hierarchically uses a register cache and a buffer together with the spin transfer torque-random access memory, to minimize leakage current, reduce a write operation power, and solve the write delay.

11 Claims, 13 Drawing Sheets

(51) Int. Cl.
    *G06F 3/06*    (2006.01)
    *G09G 5/36*    (2006.01)
(52) U.S. Cl.
    CPC ...... *G11C 11/1673* (2013.01); *G11C 11/1675* (2013.01)

(56) References Cited

U.S. PATENT DOCUMENTS

2018/0052601 A1*  2/2018  Lee ................... G06F 3/0655
2018/0293009 A1*  10/2018  Sharon ............... G06F 3/0679

OTHER PUBLICATIONS

Mark Gebhart, et al., "A Hierarchical Thread Scheduler and Register File for Energy-Efficient Throughput Processors," Apr. 2012, Association for Computing Machinery (ACM), vol. 30, No. 2, Article 8, pp. 1-38 (Year: 2012).*

Hang Zhang, et al., "Architecting Energy-efficient STT-RAM Based Register File on GPGPUs via Delta Compression," Jun. 2016, Association for Computing Machinery (ACM), pp. 1-6 (Year: 2016).*

Mohammad Sadrosadati et al., "LTRF: Enabling High-Capacity Register Files for GPUs via Hardware/Software Cooperative Register Prefetching," Mar. 28, 2018 by Association for Computing Machinery (ACM), pp. 1-14 (Year: 2018).*

Sadrosadati et al., "LTRF: Enabling High-Capacity Register Files for GPUs via Hardware/Software Cooperative Register Prefetching," Association for Computing Machinery, Mar. 2018.

* cited by examiner

<Write Operation>

HIERARCHICAL REGISTER FILE DEVICE BASED ON SPIN TRANSFER TORQUE-RANDOM ACCESS MEMORY

CROSS-REFERENCE TO RELATED APPLICATIONS

This application claims priority to and the benefit of Korean Patent Application No. 10-2019-0039236 filed in the Korean Intellectual Property Office on Apr. 3, 2019, the entire contents of which are incorporated herein by reference.

TECHNICAL FIELD

The technical field of the present disclosure relates to a register file and a graphic processing device. This study is associated with the development of an identification information processing technology for a field personnel in the complex cognitive technology development project (No. 2018M3E3A1057248).

BACKGROUND ART

The contents described in this section merely provide background information on the present exemplary embodiment but do not constitute the related art. General purpose computing on graphics processing units (GPGPU) simultaneously perform the computation by a plurality of threads and allocate registers to individual threads therefor. As a core for processing a large quantity of data is increased, a register file size of the GPGPU is gradually being increased. Currently, the register file is configured by the SRAM and occupies 15 to 20% of the entire GPGPU energy.

However, an average of 50.6% of the energy used by register files is consumed by leakage current. Therefore, a solution for reducing the used energy in accordance with the increase of the register file size of the GPGPU is necessary.

SUMMARY OF THE INVENTION

A major object of the exemplary embodiments of the present disclosure is to increase energy efficiency using a spin transfer torque-random access memory (STT-RAM) for a register file used for a computation of the general purpose computing on graphics processing units (GPGPU).

Other and further objects of the present disclosure which are not specifically described can be further considered within the scope easily deduced from the following detailed description and the effect.

According to an aspect of the present embodiment, a register file device includes a scheduler configured to select a data processing unit which is a set of instructions including an operator and an operand; a storage unit configured to hierarchically store data corresponding to the operand; an operand collector configured to receive the data from the storage unit to check a ready state of the operand; a functional unit configured to execute the data processing unit in accordance with the ready state of the operand; and an arbiter configured to store an access request received from the functional unit and allocate the stored access request to the storage unit.

The storage unit includes: a first storage unit configured to store recently used data; a second storage unit configured to store data evicted from the first storage unit for a predetermined buffer period; and a third storage unit configured to store data received from the second storage unit.

The third storage unit may be implemented as a spin transfer torque-random access memory (STT-RAM).

The register file memory device may include a compression unit configured to compress data for a predetermined compression period before being stored in the third storage unit; and a decompression unit configured to decompress the compressed data.

The arbiter may include an indicator that includes a bank pointer. The bank pointer indicates a bank number of compressed data stored in the third storage unit.

The compression unit may set reference data for a plurality of data and reduce the number of bits of data by expressing the data by a difference from the reference data.

The decompression unit may restore data by adding the difference from the reference data to the reference data.

The second storage unit may include a counter which counts the buffer period and the compression period.

When the access request is a write request, the second storage unit stores data evicted from the first storage unit for the buffer period and the compression period and the compression unit compresses data received from the second storage unit and then the third storage unit stores the compressed data.

When the access request is a read request and an operand corresponding to the read request is not in the second storage unit, the third storage unit may be checked.

The third storage unit decompresses the compressed data corresponding to the operand through the decompression unit and then transmits the data to the operand collector.

When the access request is a write request and an operand corresponding to the write request is in the first storage unit, the first storage unit may overwrite the data with new data.

When the access request is a write request and an operand corresponding to the write request is not in the first storage, the first storage unit evicts existing data to the second storage unit and then, the first storage unit overwrites the data with new data.

When the access request is a read request and an operand corresponding to the write request is in the first storage unit, the first storage unit transmits data corresponding to the operand to the operand collector.

When the access request is a read request and an operand corresponding to the read request is not in the first storage unit, the second storage unit may be checked.

When the operand corresponding to the read request is in the second storage unit, data corresponding to the operand may be transmitted to the operand collector.

According to another aspect of the present embodiment, a graphic processing device includes a multiprocessor which performs parallel-processing on data; and a register file device configured to store the data, and the register file device includes: a scheduler configured to select a data processing unit which is a set of instructions including an operator and an operand; a storage unit configured to hierarchically store data corresponding to the operand; an operand collector configured to receive the data from the storage unit to check a ready state of the operand; a functional unit configured to execute the data processing unit in accordance with the ready state of the operand; and an arbiter configured to store an access request received from the functional unit and allocate the stored access request to the storage unit.

As described above, according to the embodiments of the present disclosure, the energy efficiency is increased by using STT-RAM for a register file used at the time of computing the GPGPU and a register cache and a buffer are hierarchically used together with the STT-RAM to reduce a write operation power and write delay may be solved while minimizing the leakage current.

Even if the effects are not explicitly mentioned here, the effects described in the following specification which are expected by the technical features of the present disclosure and their potential effects are handled as described in the specification of the present disclosure.

DETAILED DESCRIPTION OF THE EMBODIMENT

Hereinafter, in the description of the present disclosure, a detailed description of the related known functions will be omitted if it is determined that the gist of the present disclosure may be unnecessarily blurred as it is obvious to those skilled in the art and some exemplary embodiments of the present disclosure will be described in detail with reference to exemplary drawings.

Figure 1:
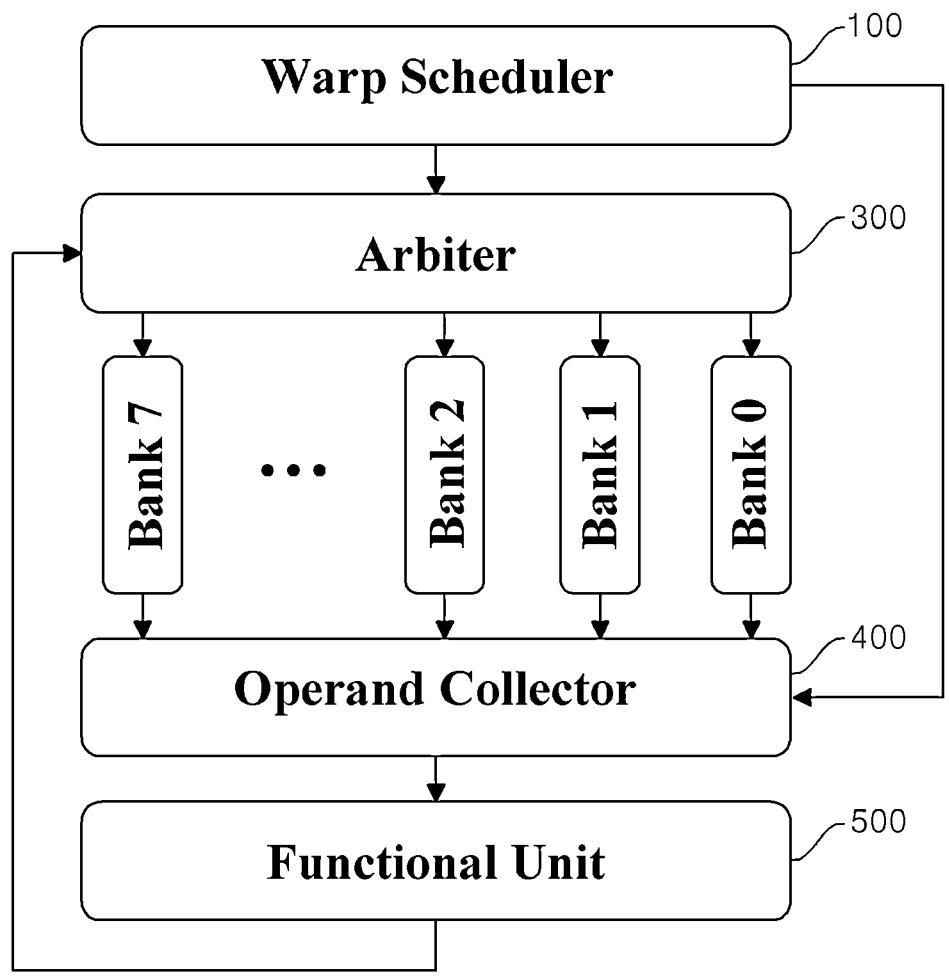
FIG. 1 is a block diagram illustrating a register file device using an existing SRAM.

FIG. 1 is a block diagram illustrating a register file device using an existing SRAM.

A warp scheduler is a unit which schedules which warp to be executed. A data processing unit may be classified into a thread and a warp. The warp is a unit executed by a single instruction multiple thread (SIMT) model at one time.

A Streaming Multiprocessor (SM) of the GPGPU executes the plurality of threads. The threads allocated to the same streaming multiprocessors share a shared memory and threads allocated to the same streaming multiprocessors may access a constant cache and a texture cache. A specific number of clocks which execute each thread may be set and a plurality of threads may be executed at every cycle unit set by the specific number of clocks. The streaming multiprocessor may execute one or more warps as the unit of warp.

The streaming multiprocessors (SM) are connected to the device memory. In each streaming multiprocessor, a plurality of stream processors (SP) is loaded. A block is a basic unit for scheduling in the multiprocessor and is continuously executed until the execution is completed in an initially allocated multiprocessor and an executing order and a processing between blocks are independent from each other. When a sufficient share resource which is used by other blocks which are ready to be executed remains, a plurality of blocks is simultaneously allocated to be executed. The blocks allocated to the multiprocessors are divided into warps to be independently executed and scheduled by a warp scheduler.

Threads which belong to the warp simultaneously execute only one instruction so that when all threads of the warp have the same execution path, a maximum efficiency can be achieved.

The GPGPU supports various types of memories to efficiently process the data and each thread is allocated with individual register and a local memory space to use while being executed. Threads in the same block may communicate with each other through a shared memory.

An arbiter allocates an access request to a bank to prevent bank conflict. The register file has a bank structure. An operand collector is a unit which notifies which operant of an instruction is ready. A functional unit performs an actual computation.

For a write operation, values in the register file need to be changed due to the computing result of the functional unit. For example, when in a warp 1, a code of r1+r2=r3 is executed, if originally, r1=1, r2=1, and r3=1, r3 is changed to 2. Since a value of r3 of the warp 1 is changed to 2, a write request to update the value of r3 of the warp 1 is stored in a queue of the arbiter. If a next instruction is r4+r5=r6 and all operands are ready in the operand collector, the functional unit performs a next instruction. The arbiter accesses the bank without causing bank conflict considering a write request and a read request in the queue. The arbiter accesses the bank to update a value corresponding to r3 of the warp 1. For a read operation, similarly to the write operation, the functional unit sends a read request. The arbiter accesses the bank considering the write request and the read request in the queue. After reading the value in the bank, the arbiter sends the value to the operand collector.

An existing register file of the GPGPU uses a static random access memory (SRAM) and an energy of the register file occupies 15 to 20% of the total energy. An average of 50.6% of the energy used by the register file to which the SRAM is applied is consumed due to the leakage current.

The register file device according to the embodiment applies an STT-RAM having a less leakage current. The STT-RAM has a very small leakage current, but has a 57% higher write power than a power of SRAM and a write delay is four times that of the SRAM. In order to solve this problem, the register file device according to the exemplary embodiment increases an energy efficiency of the GPGPU register file by applying a hierarchical memory structure and a compressing method. The register file device includes a register cache using an SRAM and includes a buffer for solving the write delay of the STT-RAM.

A GPU register file has two characteristics.

A first characteristic is that read/write access to a GPU register file is concentrated on a less number of registers. 80% or higher of average register file access is related to upper five register IDs and a register ID which focuses on the write is similar to a register ID which focuses on read. That is, the GPU register file access indicates a high locality.

In order to utilize the locality of the GPU register file according to the first characteristic, a register cache and a buffer are used. The register cache serves as a write cache of a slow STT-RAM register file. When a cache block is evicted from the register cache, the buffer stores the evicted data until the evicted data is written in the STT-RAM register file.

A second characteristic is that values of data written by adjacent threads in the same warp are similar. Most write access for the similar data value can be compressed. When the data is compressed, a less number of register file banks may be activated. When applying the compression, read/write access of several memory banks may be reduced.

When the evicted data is written in the register file according to the second characteristic, the register file device may compress the data. A compressing method may minimize a dynamic power of the STT-RAM register file. The compressed data is concentrated on the less number of banks. The register file device may distribute the write access to increase endurance of the STT-RAM register file.

The register file device according to the embodiment may be applied to a graphic processing device according to another exemplary embodiment.

Figure 2:
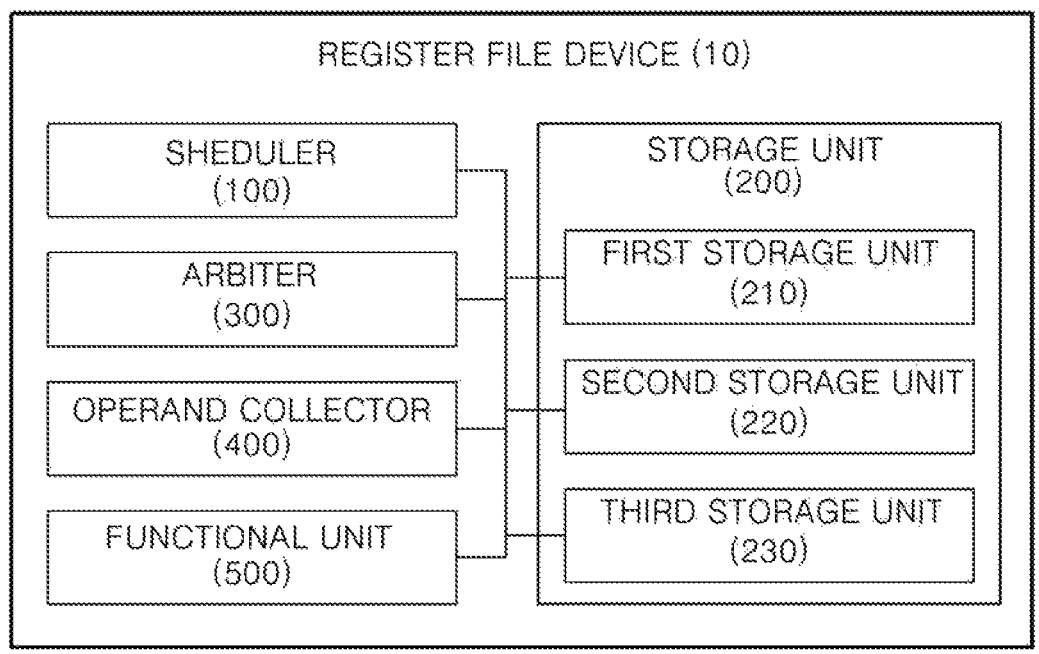
FIGS. 2 to 4 are block diagrams illustrating a register file device using an STT-RAM according to exemplary embodiments of the present disclosure.
Figure 3:
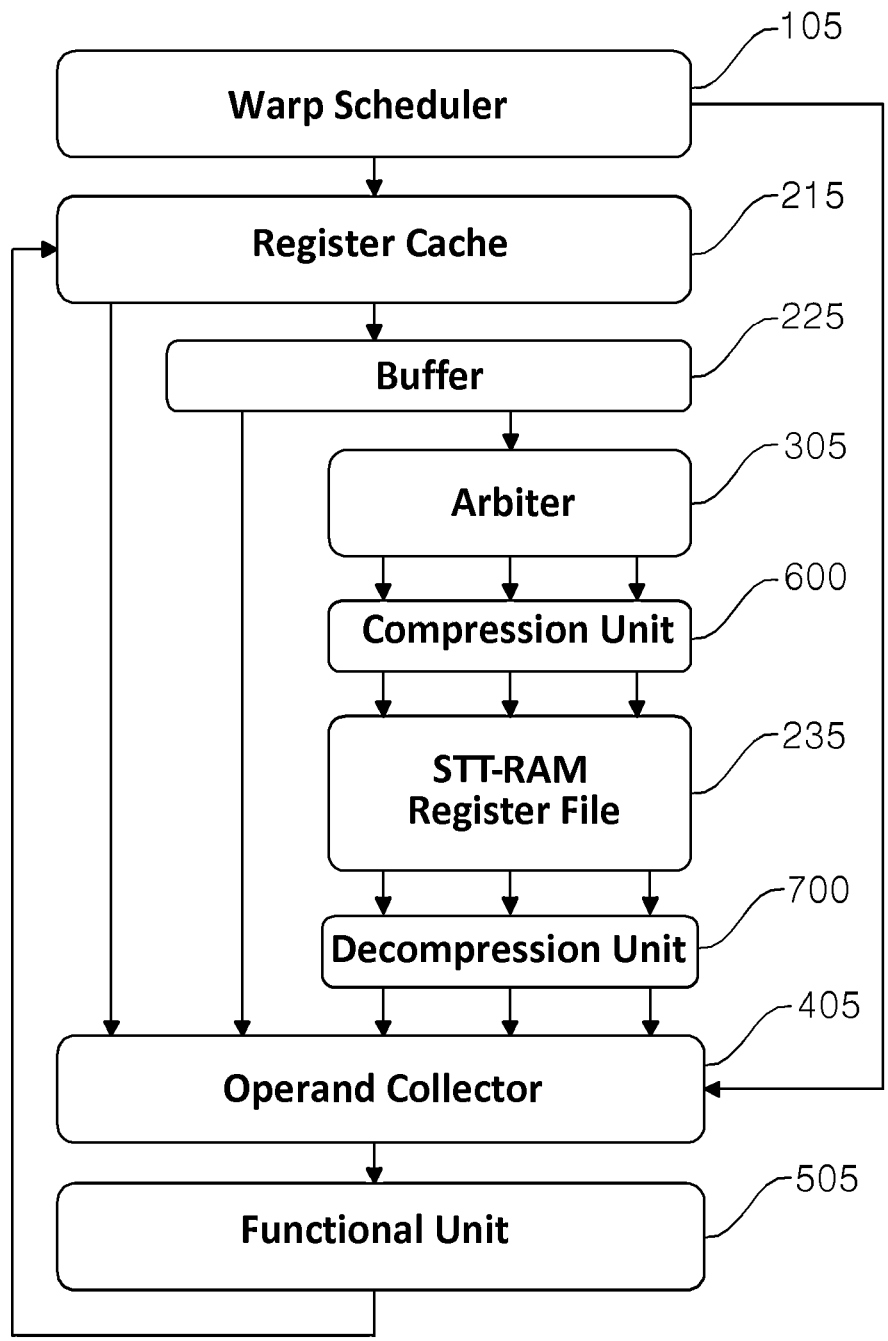
Figure 4:
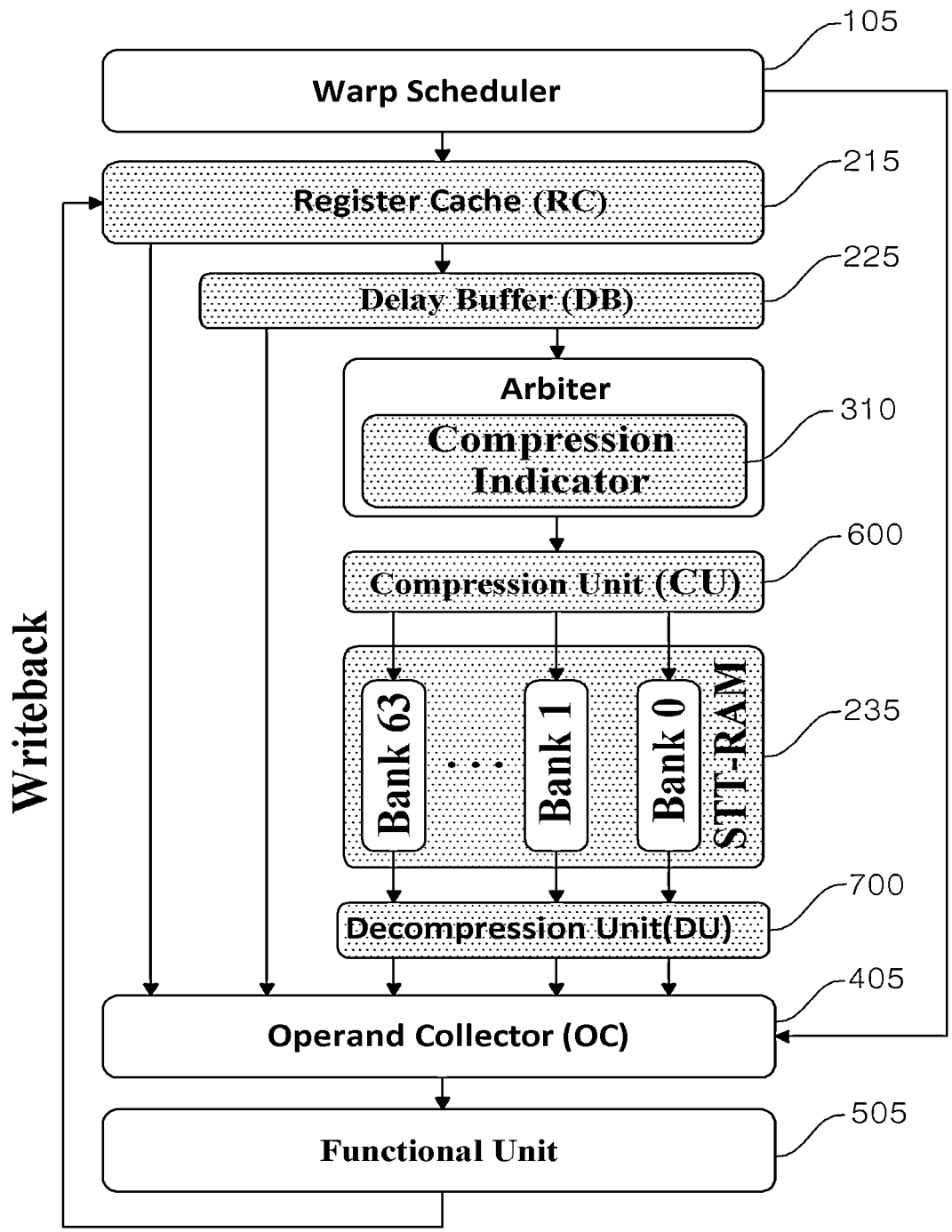

FIGS. 2 to 4 are block diagrams illustrating a register file device using an STT-RAM according to exemplary embodiments of the present disclosure.

As illustrated in FIG. 2, the register file device 10 includes a scheduler 100, a storage unit 200, an arbiter 300, an operand collector 400, and a functional unit (an execution unit) 500. The register file device 10 may omit some components among various components which are exemplarily illustrated in FIGS. 3 and 4 or may further include other component. For example, the register file device 10 may include a compression unit 600 and a decompression unit 700 and also includes an indicator 310.

Schedulers 100 and 105 select a data processing unit which is a set of instructions including an operator and an operand. The data processing unit may refer to a warp.

The storage unit 200 hierarchically stores data corresponding to the operand. The storage unit 200 includes a first storage unit 210 which stores recently used data, a second storage unit 230 which stores data evicted from the first storage unit 220 for a predetermined buffer period, and a third storage unit 230 which stores data received from the second storage unit 220.

The first storage unit is referred to as a register cache 215, the second storage unit 220 is referred to as a buffer 225, and the third storage unit 230 is referred to as a register file 235. The register cache 215 and the buffer 225 are implemented by a static random access memory (SRAM) and the register file 235 is implemented by a spin transfer torque-random access memory (STT-RAM). The STT-RAM is also referred to as an STT-MRAM.

In the magnetic random access memory (MRAM), a spin transfer torque (STT) phenomenon is used to write data into the memory. According to the STT phenomenon, when a spin-aligned current passes through a ferromagnetic material, the spin-aligned current is transmitted as an angular momentum of the ferromagnetic material due to the instantaneous change of the angular momentum. When a high density current having an aligned spin direction is input to the ferromagnetic material, if a magnetizing direction of the ferromagnetic material does not coincide with the spin direction of the current, data is written using a phenomenon that aligns the magnetizing direction to the spin direction of the current.

The arbiters 300 and 305 store an access request received from the functional units 500 and 505 and allocates the stored access request in the storage unit. When the data stored in the register file 235 is compressed data, the arbiters 300 and 305 activate a less number of banks. The indicator 310 may be implemented as a table which stores a compressing method used in the previous writing and a bank number which needs to start writing.

The operand collectors 400 and 405 receive data from the storage unit to check a ready state of the operand. When the data stored in the register file 235 is compressed data, the operand collectors 400 and 405 acquire original data through the decompression unit 700.

The functional units 500 and 505 execute a data processing unit in accordance with the ready state of the operand.

The register file device 10 may further include a compression unit 600 which compresses data during a predetermined compression period before being stored in the third storage units 230 and 235 and a decompression unit 700 which decompresses the compressed data.

The compression unit 600 sets reference data for a plurality of data and reduces the number of bits of data by expressing the data by a difference from the reference data. The decompression unit 700 restores the data by adding a difference from the reference data to the reference data.

The register file device 10 may further include a counter which counters a buffer period and a compression period. For example, the buffer period is set to be four cycles required to perform a write operation by the STT-RAM and the compression period is set to be two cycles required to perform a compression operation. The counter may be located in the second storage unit. Alternatively, the counter may be located at the outside of the second storage unit and may be connected to the second storage unit.

Figure 5:
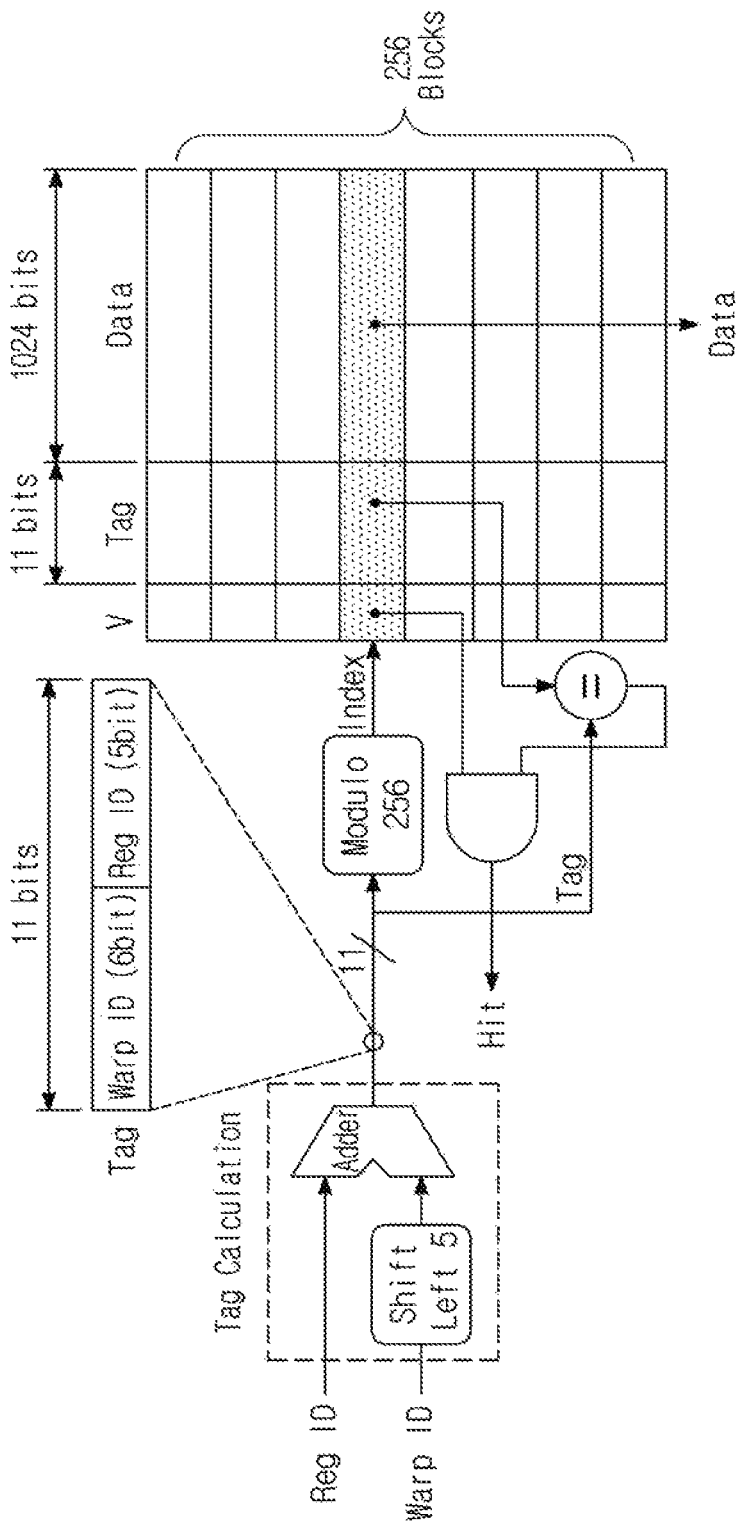
FIG. 5 is a view illustrating a register cache of a register file device using an STT-RAM according to an exemplary embodiment of the present disclosure.

FIG. 5 is a view illustrating a register cache of a register file device using an STT-RAM according to an exemplary embodiment of the present disclosure.

A register cache is a quick and temporary cache memory for write-back data. The register cache has an excellent reading performance from the STT-RAM register file so that it is more efficient to use the register cache only to write data. Requesting previous write-back register data is more likely than reusing previously read data from the register file. The register cache allocates only write data to increase a write hit ratio and reduces a number of write requests for a register file.

An implementation example of the register cache may include 256 blocks with 1036 bits wide. One cache line may include one bit of valid flag and 11 bits of tag fields. In the tag, a warp ID and a register ID may be coupled.

Figure 6:
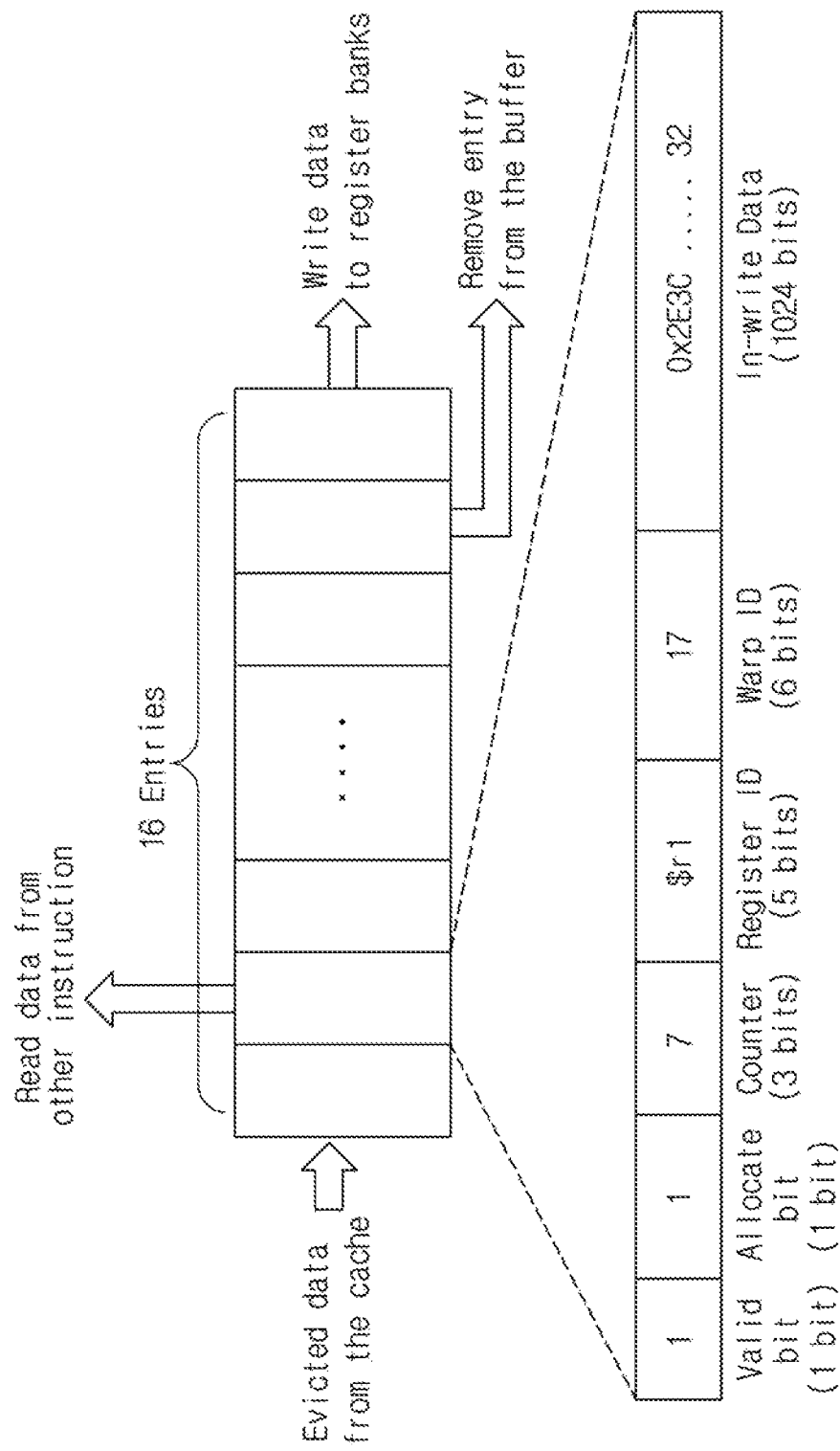
FIG. 6 is a view illustrating a buffer of a register file device using an STT-RAM according to an exemplary embodiment of the present disclosure.

FIG. 6 is a view illustrating a buffer of a register file device using an STT-RAM according to an embodiment of the present disclosure.

A delay buffer temporarily stores a data set evicted from the register cache before writing the data set in the register file. Since it takes time to compress data and to write data in the STT-RAM register file, a buffer space is used for the evicted data.

Requested data may be read out from the buffer. The data can be read while compressing the data, the compression delay may be hidden. In order to support the read operation, a buffer entry may include a control field. The control field may include a warp ID and a register ID for referring to the register data.

Figure 7:
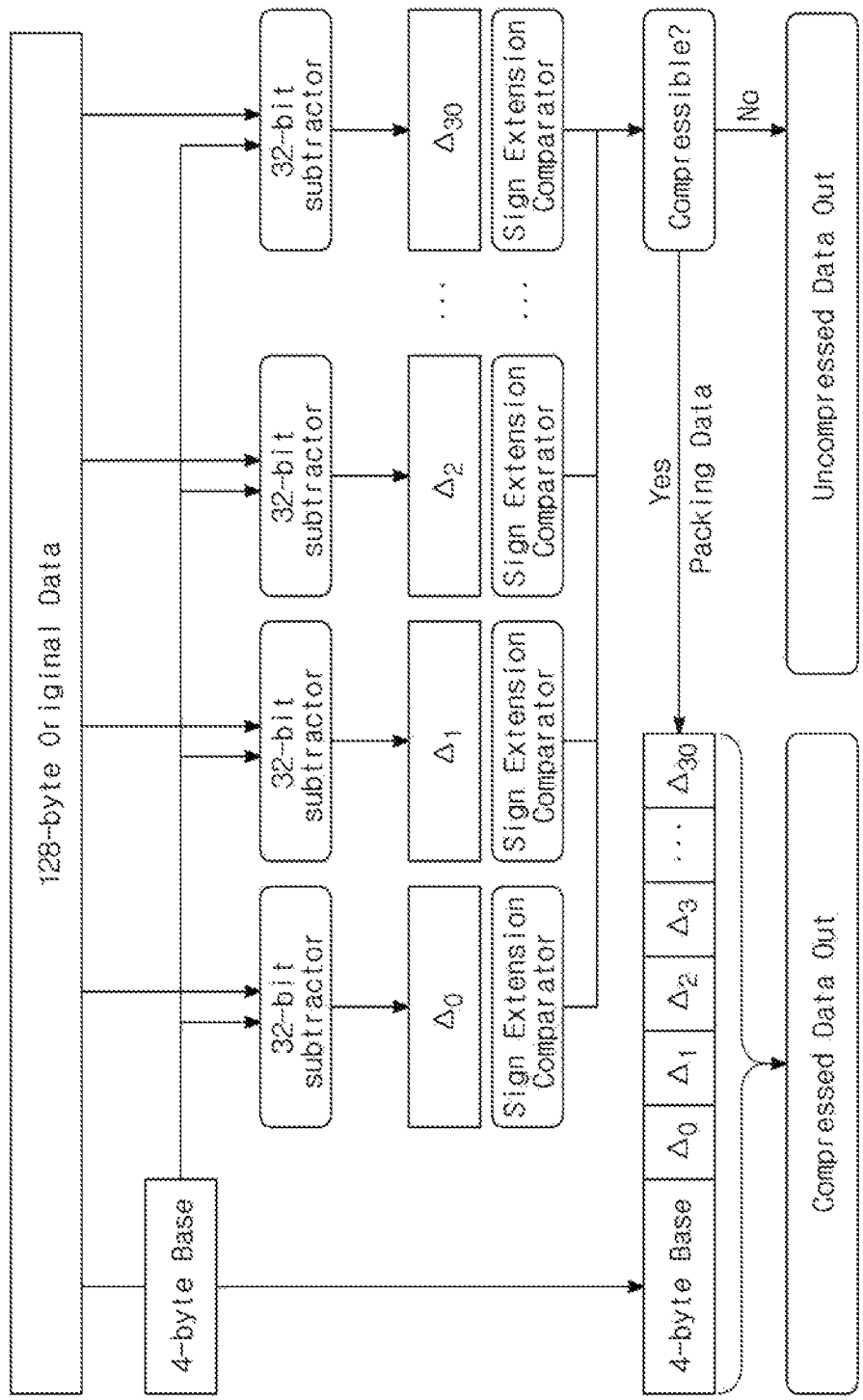
FIG. 7 is a view illustrating a compression unit of a register file device using an STT-RAM according to an exemplary embodiment of the present disclosure.

FIG. 7 is a view illustrating a compressor of a register file device using an STT-RAM according to an exemplary embodiment of the present disclosure.

The compression data may apply a compressing method using a base and a delta. Data is divided into a plurality of pieces and a first piece is set as a base and a difference from the base is represented as a delta.

The compression unit has four byte-base and applies three types of deltas including two byte-delta, one byte-delta, and zero byte-delta. A number of banks of the register file to which compressed data accesses is much smaller than a number of banks to which uncompressed data accesses.

The register file device uses a hierarchical structure to reduce the entire number of times of writing of the STT-RAM bank. When compressed data is consistently written in a specific bank, it affects a lifespan of the register bank. In order to extend the lifespan of the STT-RAM, bank leveling may be applied to the compressed data. The register file device may reduce the number of accesses to the register file and extend the lifespan of the register file by the compression and the bank leveling.

The bank leveling is to maintain the balance of the write access between banks of the register file. An indicator of the arbiter corresponds to a compression indicator table including a compression range. The compression range indicates a compressing method used for previous compression. The number of banks to access varies depending on a compressing method so that the decompression unit determines the number of banks to access by referring to the compression range.

The indicator includes a bank pointer. The bank pointer indicates a next bank number of compression data which is previously accessed. During the bank write allocating process, the arbiter transmits the bank pointer to the compression unit together with data. The compression unit identifies a bank number which starts writing using the bank pointer. While the compression unit writes data in the register file, the compression unit updates the indicator based on a new bank pointer and a compression range. During the read operation, the decompression unit recognizes the number of banks by referring to the compression range and the decompression unit identifies the bank number to start the read operation such that the number of banks to access is deducted from the bank pointer.

FIGS. 8 to 12 are flowcharts illustrating an operation of a register file device using an STT-RAM according to exemplary embodiments of the present disclosure.

Figure 8:
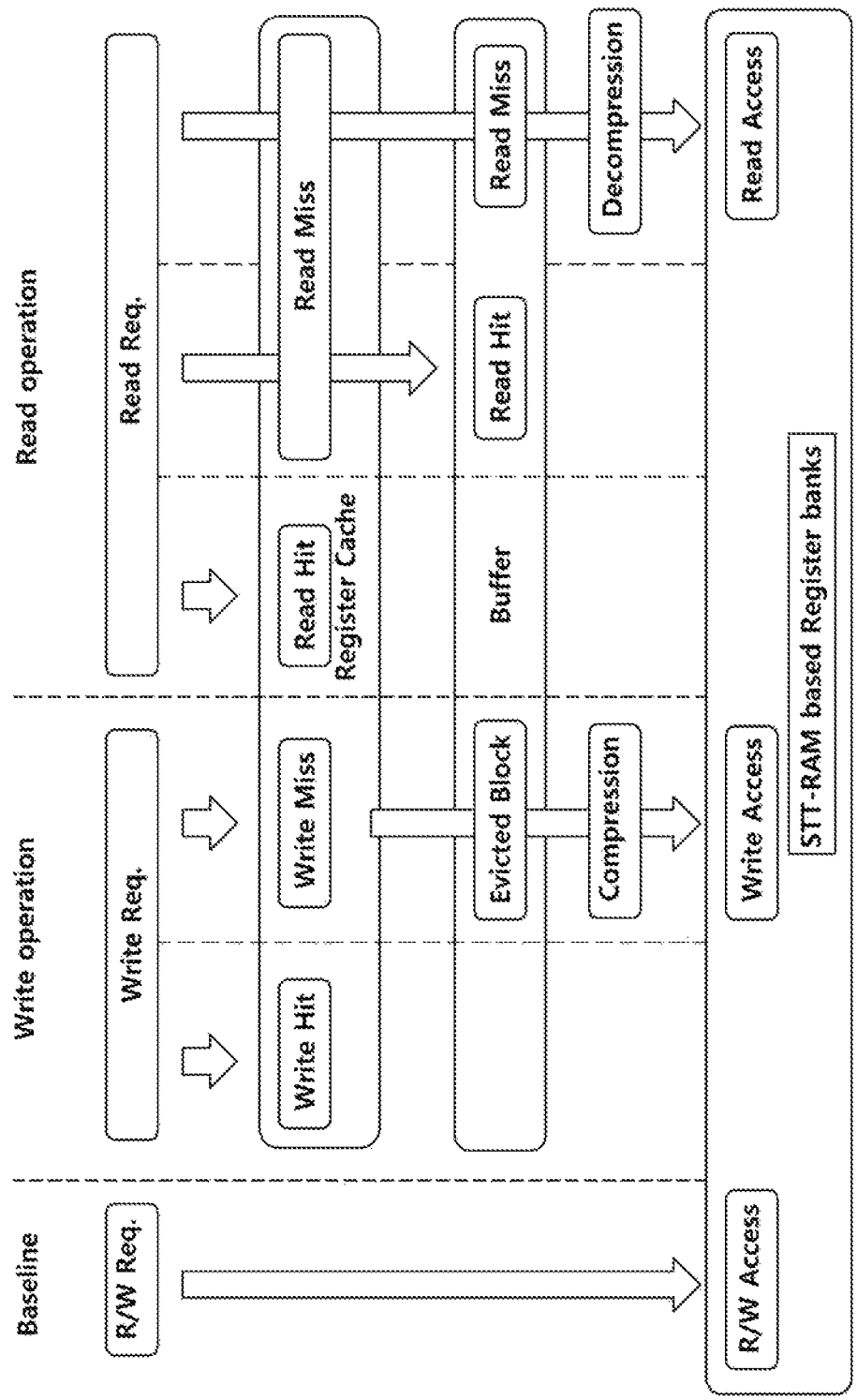
FIGS. 8 to 12 are flowcharts illustrating an operation of a register file device using an STT-RAM according to exemplary embodiments of the present disclosure.

An entire data flow will be described with reference to FIG. 8. Most recently written register data is stored in a register cache. When cache hit occurs in a register cache, the register cache reads/writes the register without eviction. When write miss occurs in the register cache, out-of-date data in the register cache is evicted and up-to-date data to be written in the register cache. The evicted data goes to a delay buffer.

Data in the delay buffer is subjected to a compression process through the compression unit and is written in the STT-RAM register file. The delay buffer stores data for four cycles for a write operation in the STT-RAM and two cycles for a compression operation.

When read miss occurs in the register cache, data in a register file which is formed of the STT-RAM is read. After searching for data once more in the delay buffer since the read miss occurs in the cache, when there is no data in upper two classes, data is read from the register file. Data restored through the decompression unit is sent to the operand collector and a computation of the GPGPU operates.

Figure 9:
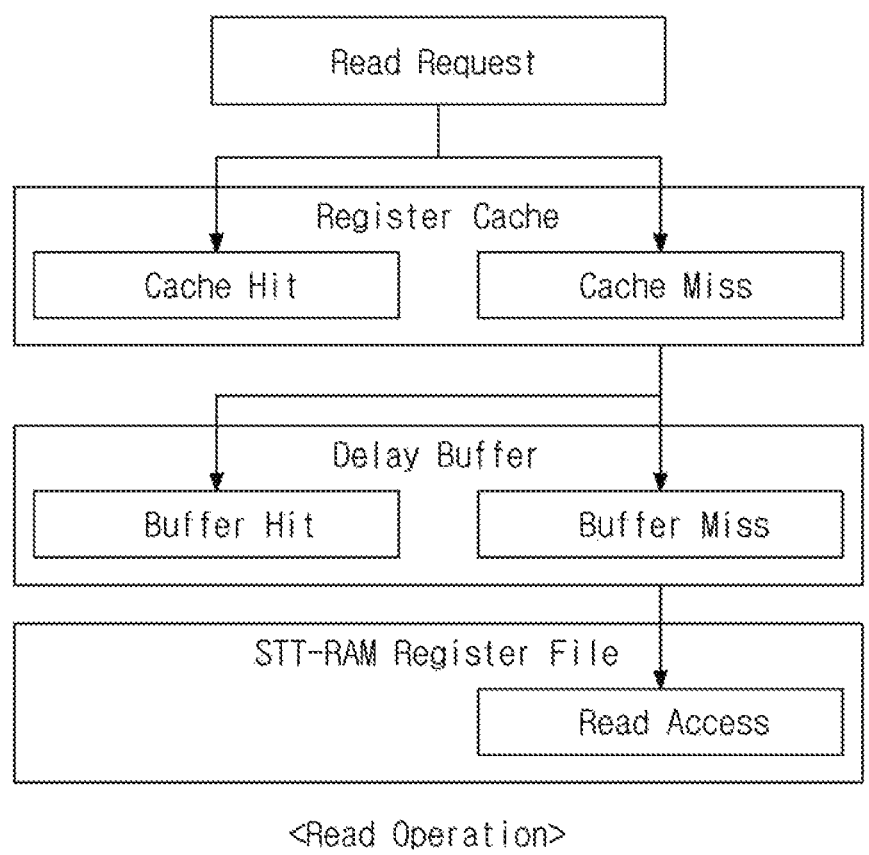

As illustrated in FIG. 9, after searching for a register cache in a read request operation, a delay buffer is searched. A register file is searched after searching for the delay buffer.

Figure 10:
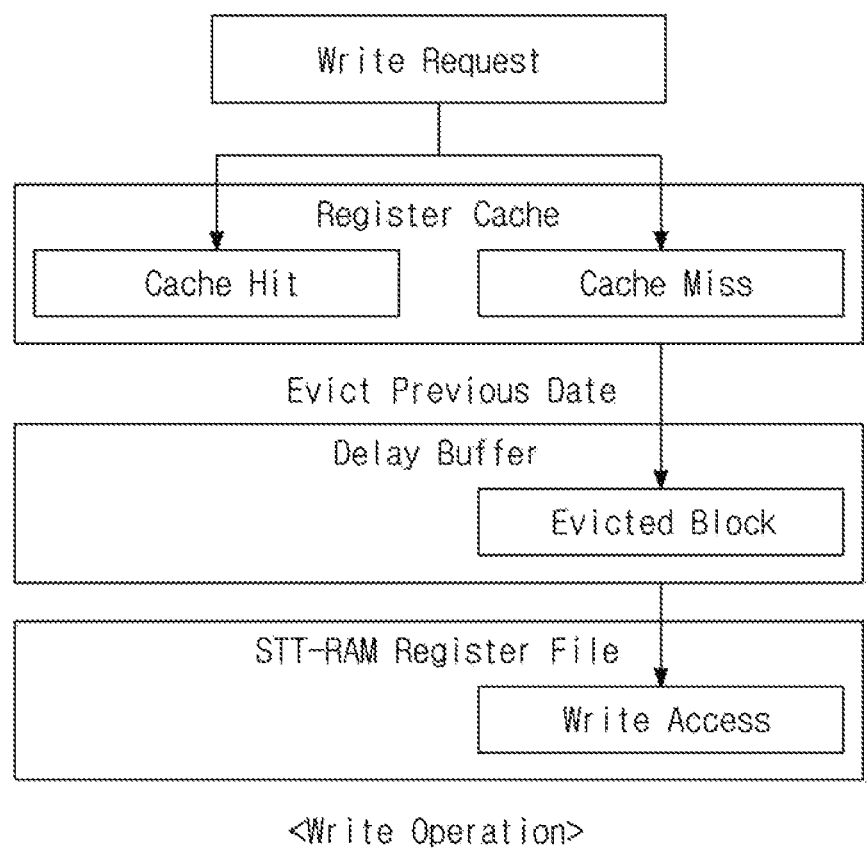

As illustrated in FIG. 10, when it is a write request operation which writes back execution result data, data accesses a register cache. When data recorded in the register cache is hit, a target cache line updates the data as a new value, otherwise, the write-back data is newly allocated to the register cache. When the register cache is already filled with write-back data, data evicted from the register cache needs to be stored in the register file. The evicted data may be compressed and the arbiter selects a bank to be activated for write.

Figure 11:
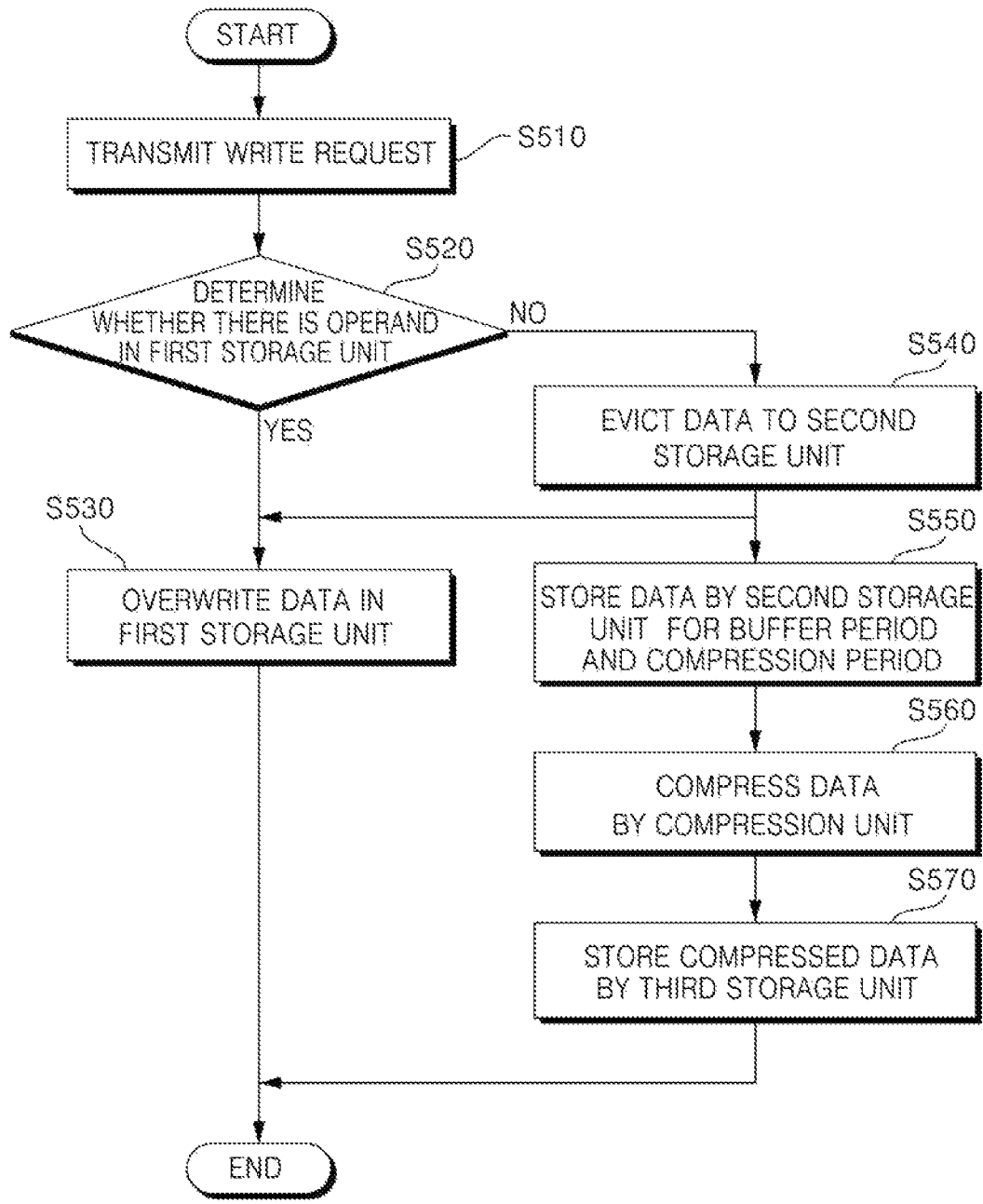
Figure 12:
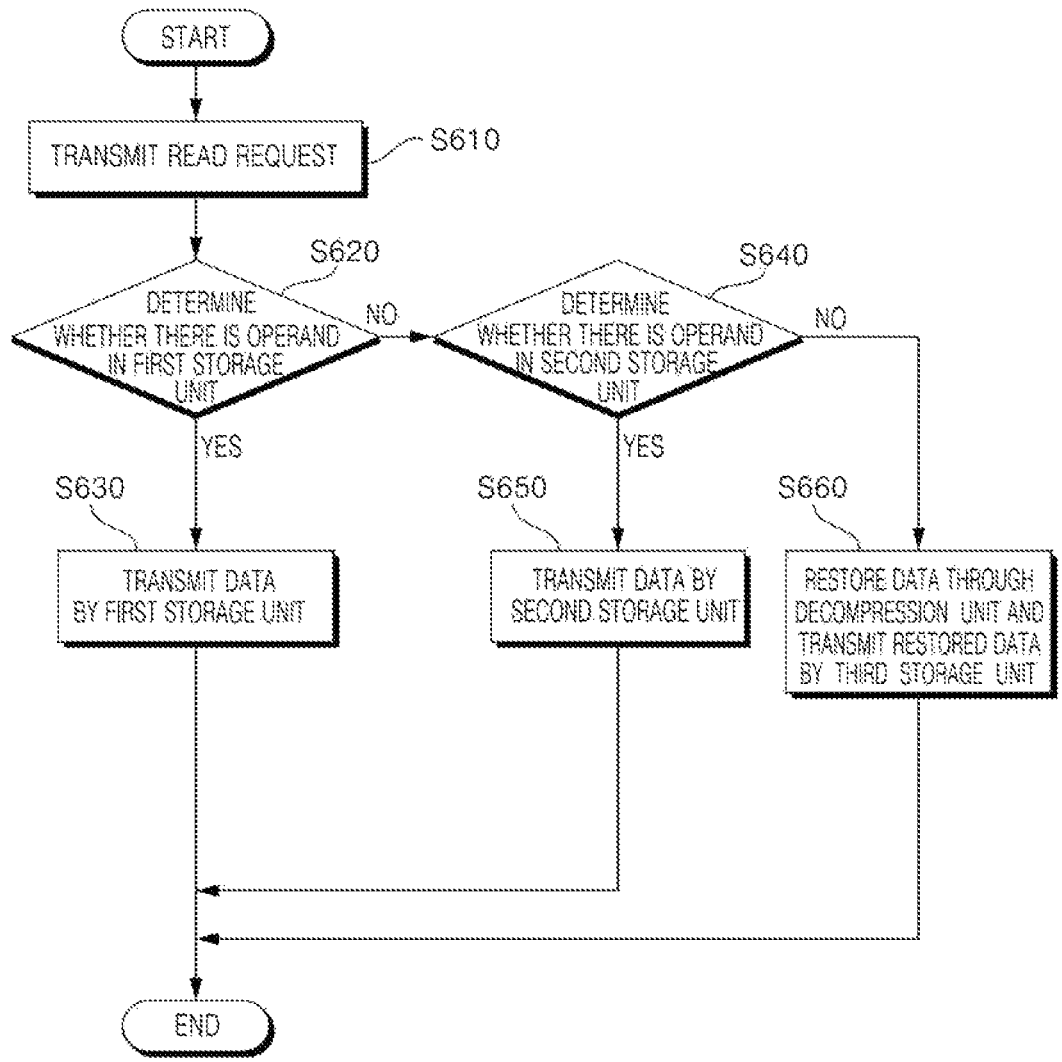

A write operation will be described with reference to FIG. 11. When r1=1, r2=1, and r3=1, if a warp 1 executes a code of r1+r2=r3 in the functional unit, r3 of the warp 1 needs to be updated to 2 to the register cache.

In step S510, the functional unit transmits a write request to the register cache. In step S520, it is determined whether an access request is a write request and an operand corresponding to the write request is in the first storage unit. A tag in the register cache is checked.

When there is an operand corresponding to a write request, in step S530, the first storage unit overwrites data with new data. For example, in the case of cache hit, a value of r3 of the warp 1 is overwritten in the register cache as it is.

When the access request is a write request and an operand corresponding to the write request is not in the first storage, in step S540, the first storage unit evicts existing data to the second storage unit and then in step S530, the first storage unit overwrites the data with new data. For example, in the case of cache miss, after evicting existing data, a value of r3 of the warp 1 is updated in the register cache.

When the access request is a write request, in step S550, the second storage unit stores data evicted from the first storage unit during a buffer period and a compression period and in step S560, the compression unit compresses data received from the second storage unit and then in step S570, the third storage unit stores the compressed data. For example, data which is evicted to be stored in the buffer is subjected to a compression process and is written in the STT-RAM. Four cycles are consumed to perform the write operation in the STT-RAM and two cycles are consumed to perform compression so that the buffer stores data for six cycles through a counter.

A read operation will be described with reference to FIG. 2. When a read operation of r3 of the warp 1 is performed, first, the register cache is confirmed.

In step S610, the functional unit transmits a read request to the register cache.

In step S620, it is determined whether an access request is a read request and an operand corresponding to the read request is in the first storage unit. When there is an operand corresponding to the read request, in step S630, the first storage unit transmits data corresponding to the operand to the operand collector. For example, in the case of cache hit, data is sent to the operand collector as it is.

When the access request is a read request and an operand corresponding to the read request is not in the first storage unit, in step S640, it is confirmed whether an operand corresponding to the read request is in the second storage unit. For example, in the case of cache miss, it is confirmed whether there is r3 of the warp 1 in the buffer.

When there is an operand corresponding to the read request in the second storage unit, in step S650, the second storage unit transmits data corresponding to the operand to the operand collector. When it is hit that there is data of r3 of the warp 1 in the buffer, the data is sent to the operand collector.

When the access request is a read request and an operand corresponding to the read request is not in the second storage unit, the third storage unit is checked. For example, when there is no data of r3 of the warp 3 in the buffer, the STT-RAM register file is checked.

In step S660, the third storage unit restores the compressed data through the decompression unit and then transmits the restored data to the operand collector.

Figure 13:
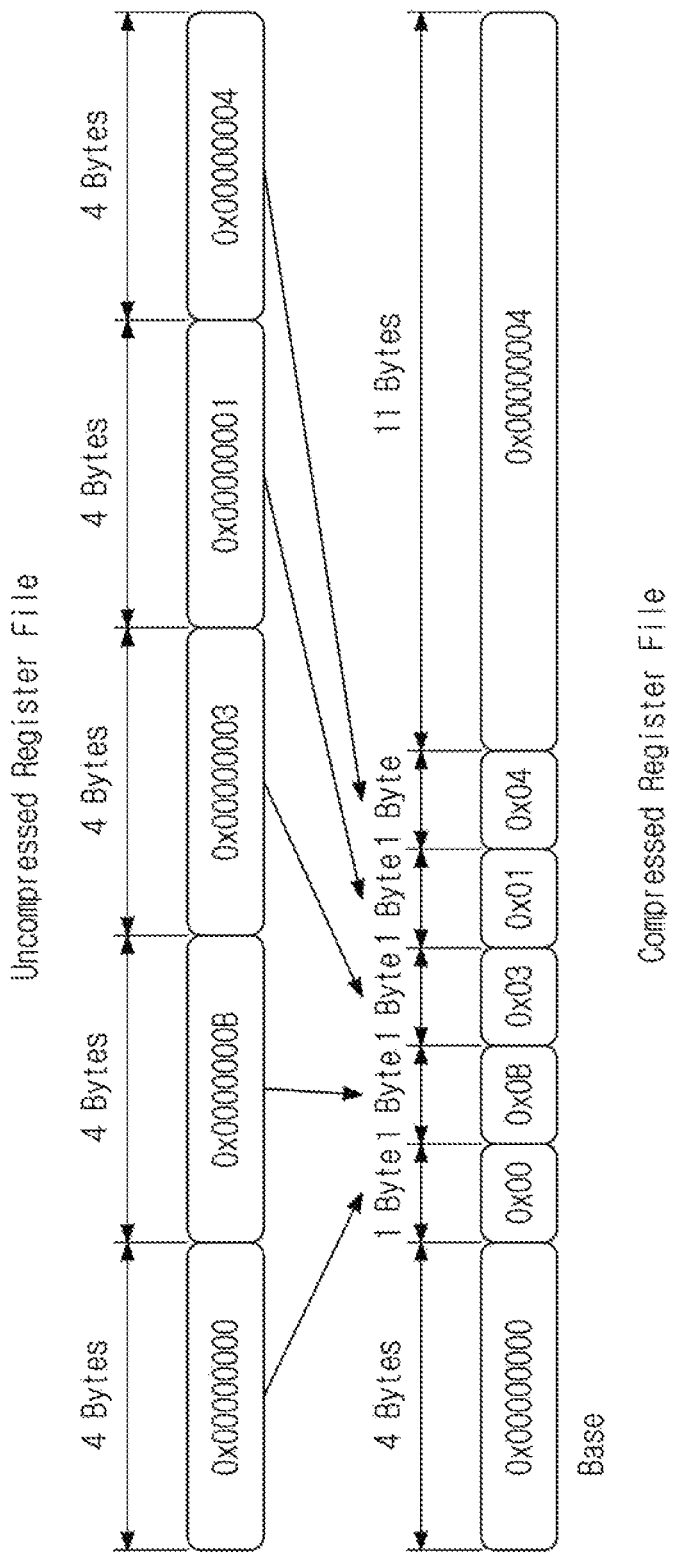
FIG. 13 is a view illustrating a compressing method applied to a register file device using an STT-RAM according to an exemplary embodiment of the present disclosure.

FIG. 13 is a view illustrating a compressing method applied to a register file device using an STT-RAM according to an embodiment of the present disclosure.

The register file device minimizes the number of bits used for the register using the compression unit.

The compression unit sets reference data for a plurality of data and reduces the number of bits of data by expressing the data by a difference from the reference data. In order to reduce the number of bits of data used for the STT-RAM, data is compressed in a base delta immediate (BDI) manner. As illustrated in FIG. 13, the BDI method is a compression method, when a plurality of data is input, which represents data by the first data and a difference between the rest of input data and the first data. The first data is set as a base and the rest of the input data is represented as a delta.

The decompression unit restores the data by adding a difference from the reference data to the reference data.

As a result of comparison with a register file device only using the existing STT-RAM through simulation in view of energy efficiency, it is confirmed that an STT-RAM based hierarchical register file which uses a register cache and a buffer without compressing data improves 65% of an energy efficiency of the register file and an STT-RAM based hierarchical register file which compresses data, applies bank leveling, and uses a register cache and a buffer improves 71% of an energy efficiency of the register file.

As a result of comparison with a register file device only using the existing SRAM through simulation in view of durability, it is confirmed that an STT-RAM based hierarchical register file which uses a register cache reduces 86% of write access and an STT-RAM based hierarchical register file which applies bank leveling and uses a register cache reduces 94% of write access.

As a result of comparison with a register file device only using the existing SRAM through simulation in view of a hardware size, it is confirmed that in an STT-RAM based hierarchical register file which applies bank leveling and uses a register cache, a register cache occupies 30%, a buffer occupies 5%, a compression unit/decompression unit occupies 36%, and a register file occupies 19% to occupy a total of 91%, which reduces a total of 9% of the size as compared with the related art.

It can be easily understood that the register file device according to the exemplary embodiment applies a hierarchical storage structure and bank leveling to be differentiated in view of the energy efficiency and the durability and have excellent effects.

A plurality of components included in the register file device is combined to each other to be implemented by at least one module. The components are connected to a communication path which connects a software module or a hardware module in the apparatus to organically operate between the components. The components communicate with each other using one or more communication buses or signal lines.

The register file device may be implemented in a logic circuit by hardware, firm ware, software, or a combination thereof or may be implemented using a general purpose or special purpose computer. The device may be implemented using hardwired device, field programmable gate array (FPGA) or application specific integrated circuit (ASIC). Further, the device may be implemented by a system on chip (SoC) including one or more processors and a controller.

The register file device may be mounted in a computing device provided with a hardware element as a software, a hardware, or a combination thereof. The computing device may refer to various devices including all or some of a communication device for communicating with various devices and wired/wireless communication networks such as a communication modem, a memory which stores data for executing programs, and a microprocessor which executes programs to perform operations and commands.

The operation according to the exemplary embodiment of the present disclosure may be implemented as a program command which may be executed by various computers to be recorded in a computer readable medium. The computer readable medium indicates an arbitrary medium which participates to provide a command to a processor for execution. The computer readable medium may include solely a program command, a data file, and a data structure or a combination thereof. For example, the computer readable medium may include a magnetic medium, an optical recording medium, and a memory. The computer program may be distributed on a networked computer system so that the computer readable code may be stored and executed in a distributed manner. Functional programs, codes, and code segments for implementing the present embodiment may be easily inferred by programmers in the art to which this embodiment belongs.

The present embodiments are provided to explain the technical spirit of the present embodiment and the scope of the technical spirit of the present embodiment is not limited by these embodiments. The protection scope of the present embodiments should be interpreted based on the following appended claims and it should be appreciated that all technical spirits included within a range equivalent thereto are included in the protection scope of the present embodiments.

What is claimed is:

1. A register file device comprising:
  a scheduler configured to select a data processing unit which is a set of instructions including an operator and an operand;
  a storage unit configured to hierarchically store data corresponding to the operand;
  an operand collector configured to receive the data from the storage unit to check a ready state of the operand;
  a functional unit configured to execute the data processing unit in accordance with the ready state of the operand; and
  an arbiter configured to store an access request received from the functional unit and allocate the stored access request to the storage unit,
  wherein the storage unit includes:
    a first storage unit configured to store recently used data;
    a second storage unit configured to store data evicted from the first storage unit for a predetermined buffer period; and
    a third storage unit configured to store data received from the second storage unit, and
  wherein the register file device further comprises:
    a compression unit configured to compress data for a predetermined compression period before being stored in the third storage unit; and
    a decompression unit configured to decompress the compressed data,
    wherein the second storage unit further includes a counter which counts a number of cycles in the predetermined buffer period and the predetermined compression period.

2. The register file device according to claim 1, wherein the third storage unit is implemented as a spin transfer torque-random access memory (STT-RAM).

3. The register file device according to claim 1, wherein the arbiter includes an indicator which indicates a bank number of the compressed data stored in the third storage unit.

4. The register file device according to claim 1, wherein the compression unit sets reference for a plurality of data and reduces a number of bits of data by representing the data by a difference from reference data, and the decompression unit restores data by adding the difference from the reference data to the reference data.

5. The register file device according to claim 1, wherein when the access request is a write request, the second storage unit stores the data evicted from the first storage unit for the predetermined buffer period and the compression period and the compression unit compresses data received from the second storage unit and then the third storage unit stores the compressed data.

6. The register file device according to claim 1, wherein when the access request is a read request and an operand corresponding to the read request is not in the second storage unit, the third storage unit is checked, and
the third storage unit decompresses the compressed data corresponding to the operand through the decompression unit and then transmits the data to the operand collector.

7. The register file device according to claim 1, wherein when the access request is a write request and an operand corresponding to the write request is in the first storage unit, the first storage unit overwrites the data with new data.

8. The register file device according to claim 7, wherein when the access request is a write request and an operand corresponding to the write request is not in the first storage, the first storage unit evicts existing data to the second storage unit and then the first storage unit overwrites the data with new data.

9. The register file device according to claim 1, wherein when the access request is a read request and an operand corresponding to the read request is in the first storage unit, the first storage unit transmits data corresponding to the operand to the operand collector.

10. The register file device according to claim 9, wherein when the access request is a read request and an operand corresponding to the read request is not in the first storage unit, the second storage unit is checked, and
when the operand corresponding to the read request is in the second storage unit, data corresponding to the operand is transmitted to the operand collector.

11. A graphic processing device, comprising:
a multiprocessor which performs parallel-processing on data; and
a register file device configured to store the data,
wherein the register file device includes:
a scheduler configured to select a data processing unit which is a set of instructions including an operator and an operand;
a storage unit configured to hierarchically store data corresponding to the operand;
an operand collector configured to receive the data from the storage unit to check a ready state of the operand;
a functional unit configured to execute the data processing unit in accordance with the ready state of the operand; and
an arbiter configured to store an access request received from the functional unit and allocate the stored access request to the storage unit,
wherein the storage unit includes:
a first storage unit configured to store recently used data;
a second storage unit configured to store data evicted from the first storage unit for a predetermined buffer period; and
a third storage unit configured to store data received from the second storage unit, and
wherein the register file device further includes:
a compression unit configured to compress data for a predetermined compression period before being stored in the third storage unit; and
a decompression unit configured to decompress the compressed data, and
wherein the second storage unit further includes a counter which counts a number of cycles in the predetermined buffer period and the predetermined compression period.

* * * * *